United States Patent [19]
Iwata et al.

[11] Patent Number: 5,846,695
[45] Date of Patent: Dec. 8, 1998

[54] REMOVING AGENT COMPOSITION FOR A PHOTORESIST AND PROCESS FOR PRODUCING A SEMICONDUCTOR INTEGRATED CIRCUIT

[75] Inventors: Keiichi Iwata; Tetsuya Karita; Tetsuo Aoyama, all of Niigata-ken, Japan

[73] Assignee: Mitsubishi Gas Chemical Company, Inc., Tokyo, Japan

[21] Appl. No.: 829,697

[22] Filed: Mar. 26, 1997

[30] Foreign Application Priority Data

Apr. 12, 1996 [JP] Japan .................................. 8-091521

[51] Int. Cl.$^6$ ...................................................... G03C 5/00
[52] U.S. Cl. ......................... 430/331; 430/313; 430/325
[58] Field of Search ..................... 430/331, 313, 430/325

[56] References Cited

U.S. PATENT DOCUMENTS

| | | | |
|---|---|---|---|
| 4,786,578 | 11/1988 | Neisius et al. | 430/256 |
| 5,091,103 | 2/1992 | Dean et al. | 252/162 |
| 5,102,777 | 4/1992 | Lin et al. | 430/331 |
| 5,482,566 | 1/1996 | Lee | 134/42 |
| 5,612,304 | 3/1997 | Honda et al. | 510/176 |

FOREIGN PATENT DOCUMENTS

| | | |
|---|---|---|
| 0 463 423 A1 | 1/1992 | European Pat. Off. . |
| 0 578 507 A2 | 1/1994 | European Pat. Off. . |
| 0 647 884 A1 | 4/1995 | European Pat. Off. . |
| 0 723 205 A1 | 7/1996 | European Pat. Off. . |
| 7028254 | 1/1995 | Japan . |

OTHER PUBLICATIONS

Patent Abstracts of Japan, vol. 95, No. 4, 31 May 1995 of JP 07 028254 (Kanto Chem. Co.), 31 Jan. 1995.
Patent Abstracts of Japan, vol.96, No. 2, 29 Feb. 1996 of JP 07 28304 A (Mitsubishi Gas Co.), 27 Oct. 1995.

Wai Mun Lee, "A New Approach in Photoresist Stripping and Post Plasma Etch/Ash Wafer Cleaning for Submicron Processes", Extended Abstracts, Spring Meeting, (1993) May 16–21, Honolulu, vol. 93/1, 1 Jan. 1993, Pennington, NJ, pp. 488–499.

English translation of JP 07028254 cited in the prior office action.

*Primary Examiner*—Janet C. Baxter
*Assistant Examiner*—Rosemary Ashton
*Attorney, Agent, or Firm*—Frishauf, Holtz, Goodman, Langer & Chick, P.C.

[57] ABSTRACT

A removing agent composition for a photoresist comprising 0.01 to 20% by weight of a quaternary ammonium hydroxide, 1 to 80% by weight of a nucleophilic amine having an oxidation-reduction potential, 0.5 to 20% by weight of a sugar and/or a sugar alcohol, and water in the remaining amount; and a process for producing a semiconductor integrated circuit comprising removing a photoresist applied onto an inorganic substrate by using the above removing agent composition.

A layer of a photoresist applied onto an inorganic substrate, a layer of a photoresist remaining after dry etching of an inorganic substrate which is masked by the layer, or residues of a layer of a photoresist remaining after dry etching of an inorganic substrate which is masked by the layer and subsequent ashing of the layer can easily be removed at a low temperature in a short time. The wiring material of the circuit is not corroded at all, and ultra-fine working can be performed.

19 Claims, 1 Drawing Sheet

5,846,695

REMOVING AGENT COMPOSITION FOR A PHOTORESIST AND PROCESS FOR PRODUCING A SEMICONDUCTOR INTEGRATED CIRCUIT

FIELD OF THE INVENTION

The present invention relates to a removing agent composition used for removing a photoresist in a process for producing a semiconductor integrated circuit and to a process for producing a semiconductor integrated circuit.

PRIOR ART OF THE INVENTION

Semiconductor integrated circuits are produced by a process in which a photoresist is applied onto an inorganic substrate, a pattern is formed on the photoresist by exposure to light and subsequent development, the formed pattern on the photoresist is used as a mask, the portions of the inorganic substrate not masked by the pattern of the photoresist are etched to form fine circuits, and then the photoresist is removed from the inorganic substrate; or by a process in which, after fine circuits are formed by the same steps as those described, the photoresist is ashed, and remaining residues of the photoresist are removed from the inorganic substrate.

Heretofore, as the removing liquid for the photoresist in these processes, acidic removing agents or alkaline removing agents have generally been used.

Examples of the acidic removing agent include a removing agent comprising an arylsulfonic acid such as benzenesulfonic acid, toluenesulfonic acid, and xylenesulfonic acid, a phenol, and an organic solvent containing chlorine (U.S. Pat. No. 3,582,401) and a removing agent comprising an aromatic hydrocarbon such as naphthalene, a phenol, and an arylsulfonic acid (Japanese Patent Application Laid-Open No. Showa 62(1987)-35357).

These acidic removing agents have weak removing ability and show a large corrosive effect to aluminum and copper which are frequently used as the wiring material for the formation of fine circuits. Therefore, these agents are not suitable for the fine works to which strict dimensional accuracy has been required in recent years. Moreover, because the solubility of these acidic removing agents in water is low, it is necessary that the product obtained after the removal of the photoresist be rinsed with an organic solvent, such as an alcohol, and subsequently cleaned with water. This causes a drawback in that the process is more complicated.

Examples of the alkaline removing agent include a removing agent comprising an addition product of ethylene oxide to an alkanolamine or a polyalkylenepolyamine, a sulfone compound, and a glycol monoalkyl ether (Japanese Patent Application Laid-Open No. Showa 62(1987)-49355), and a removing agent comprising dimethyl sulfoxide as the main component, a diethylene glycol monoalkyl ether, and an organic hydroxy compound containing nitrogen (Japanese Patent Application Laid-Open No. Showa 64(1989)-42653).

However, these alkaline removing agents dissociate with moisture absorbed during use to generate an amine and become alkaline. Therefore, when cleaning with an organic solvent, such as an alcohol, is not conducted between the removal of the photoresist and the cleaning with water, the product is alkaline at the time of the cleaning with water. The alkaline removing agents show a large corrosive effect to aluminum and copper which are frequently used as the wiring material for the formation of fine circuits. Therefore, these agents are not suitable for the fine works to which strict dimensional accuracy has been required in recent years. Moreover, when the alkaline removing agents are used, it is necessary that the product obtained after the removal of the photoresist be rinsed with an organic solvent, such as an alcohol. This causes a drawback in that the process is more complicated.

In recent years, because the process for forming circuits tends to be ultra-fine, the condition of etching the materials used in the circuits also tends to be severer, and the photoresist used in the process tends to be deteriorated. Because the acidic removing agents and the alkaline removing agents described above show rather weak removing ability, the problem arises that the photoresist is left remaining on the inorganic substrate.

Therefore, in order to solve the above problems, a removing agent which can easily remove films, layers, and residues of the photoresist and does not cause corrosion of the wiring material in the circuit is required.

SUMMARY OF THE INVENTION

Accordingly, the present invention has the object of solving the above problems of the removing agents used in the conventional technology and providing a removing agent composition for a photoresist which can remove a layer of a photoresist applied onto an inorganic substrate, a layer of a photoresist remaining after dry etching of an inorganic substrate which is masked by the layer, or residues of a layer of a photoresist remaining after dry etching of an inorganic substrate which is masked by the layer and subsequent ashing of the layer easily at a low temperature in a short time, enables ultra-fine working without causing corrosion of the wiring material of the circuit at all, allows rinsing of the product obtained after the removal of the photoresist with water alone without rinsing with an organic solvent, such as an alcohol, and leads to producing a circuit with a high accuracy.

As the result of the extensive studies by the present inventors to solve the above problems, it was discovered that a removing agent composition comprising an aqueous solution containing a quaternary ammonium hydroxide, a nucleophilic amine compound having an oxidation-reduction potential, a sugar and/or a sugar alcohol enables removal of a photoresist easily at a low temperature in a short time in a process for producing semiconductor integrated circuits, and that the above composition exhibits a combination of the advantageous properties namely, that the composition does not show any corrosive property, and no corrosion of the wiring material used in the circuit takes place and that the operation can be facilitated.

Accordingly, the present invention provides: a removing agent composition for a photoresist comprising 0.01 to 20% by weight of a quaternary ammonium hydroxide represented by the general formula $[(R^1)_3N\text{---}R]^+.OH^-$ (wherein R represents an alkyl group having 1 to 4 carbon atoms or a hydroxy-substituted alkyl group having 1 to 4 carbon atoms, and $R^1$ represents an alkyl group having 1 to 3 carbon atoms), 1 to 80% by weight of a nucleophilic amine having an oxidation-reduction potential, 0.5 to 20% by weight of a sugar and/or a sugar alcohol, and water in the remaining amount; and a process for producing a semiconductor integrated circuit comprising removing a photoresist applied onto an inorganic substrate by using the removing agent composition described above.

Figure 1:
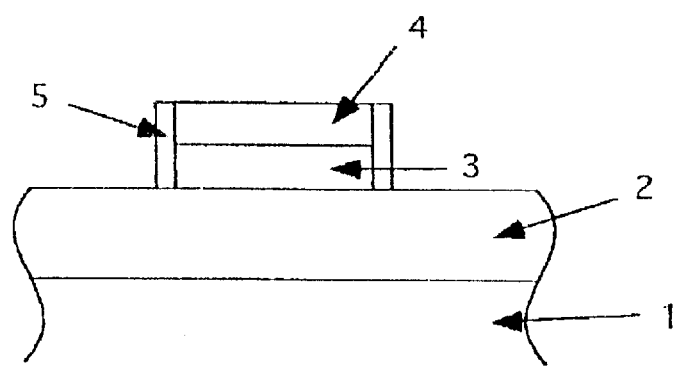
FIG. 1 shows a sectional view of a semiconductor integrated circuit obtained by forming a circuit of aluminum 3 by dry etching using a layer of a resist 4 as the mask.

The numbers in the figures have the meanings as listed in the following:
1: an apparatus for producing a semiconductor integrated circuit
2: a layer of an oxide
3: a circuit of aluminum
4: a layer of a photoresist
5: a photoresist at the side or a residue of the photoresist at the side

DETAILED DESCRIPTION OF THE INVENTION

The quaternary ammonium hydroxide used in the present invention is represented by the general formula: $[(R^1)_3N—R]^+ \cdot OH^-$ (wherein R represents an alkyl group having 1 to 4 carbon atoms or a hydroxy-substituted alkyl group having 1 to 4 carbon atoms, and $R^1$ represents an alkyl group having 1 to 3 carbon atoms).

Examples of the quaternary ammonium hydroxide represented by the above formula include tetramethylammonium hydroxide, tetraethylammonium hydroxide, tetrapropylammonium hydroxide, tetrabutylammonium hydroxide, trimethylethylammonium hydroxide, dimethyldiethylammonium hydroxide, trimethyl(2-hydroxyethyl)ammonium hydroxide, triethyl(2-hydroxyethyl)ammonium hydroxide, tripropyl(2-hydroxyethyl)ammonium hydroxide, trimethyl(1-hydroxypropyl)ammonium hydroxide, and tributyl(2-hydroxyethyl)ammonium hydroxide.

Among these quaternary ammonium hydroxides, tetramethylammonium hydroxide (hereinafter, referred to as TMAH) and trimethyl(2-hydroxyethyl)ammonium hydroxide (hereinafter referred to as choline) are particularly preferable.

The concentration of the quaternary ammonium hydroxide is 0.01 to 20% by weight, preferably 0.1 to 10% by weight, of the whole solution. When the concentration of the quaternary ammonium hydroxide is lower than the specified range, the speed of removal of the photoresist is low. When the concentration is higher than the specified range, corrosion of the wiring material in the circuit cannot be prevented.

Examples of the nucleophilic amine compound having an oxidation-reduction potential which is used in combination with the quaternary ammonium hydroxide in the present invention include hydrazines represented by the general formula $R^1R^2N—NR^3R^4$ (wherein $R^1$, $R^2$, $R^3$, and $R^4$ represent each a hydrogen atom or an alkyl group, a cycloalkyl group, an alkenyl group, an alkynyl group, a substituted carboxyl group, an alkylamino group, or a hydroxy-substituted alkyl group, each having 1 to 6 carbon atoms), derivatives of these hydrazines, salts of these hydrazines and derivatives of hydrazines, hydroxylamines represented by the general formula $R^1R^2N—O—R^3$ (wherein $R^1$, $R^2$, and $R^3$ represent each a hydrogen atom or an alkyl group, a cycloalkyl group, an alkenyl group, an alkynyl group, a substituted carboxyl group, an alkylamino group, or a hydroxy-substituted alkyl group, each having 1 to 6 carbon atoms), derivatives of these hydroxylamines, and salts of these hydroxylamines and derivatives of hydroxylamines.

Specific examples of the hydrazine include hydrazine, methylhydrazine, 1,1-dimethylhydrazine, hydrazinoethanol, and salts of these compounds. Specific examples of the hydroxylamine include N-methylhydroxylamine, N,N-dimethylhydroxylamine, N,N-diethylhydroxylamine, and salts of these compounds.

The concentration of the nucleophilic amine compound having an oxidation-reduction potential is in the range of 1 to 80% by weight, preferably 3 to 40% by weight, of the whole solution. When the concentration is lower than the specified range, the speed of removal of the photoresist is low.

Examples of the sugar used in the present invention include monosaccharides and polysaccharides. Specific examples of the sugar include glycerol aldehydes having 3 to 6 carbon atoms, threose, arabinose, xylose, ribose, ribulose, xylulose, glucose, mannose, galactose, tagatose, allose, altrose, gulose, idose, talose, sorbose, psicose, and fruit sugar. Examples of the sugar alcohol include threitol, erythritol, adonitol, arabitol, xylitol, talitol, sorbitol, mannitol, iditol, and dulcitol.

Among these compounds, glucose, mannose, galactose, sorbitol, mannitol, and xylitol are preferable in view of the solubility and the property of decomposition.

The concentration of the sugar or the sugar alcohol is in the range of 0.5 to 20% by weight, preferably 1 to 15% by weight, of the whole solution. When the concentration of the sugar or the sugar alcohol is lower than the specified range, corrosion of the wiring material in the circuit cannot sufficiently be prevented. When the concentration is higher than the specified range, no additional advantage can be found, and the concentration is not preferable in view of the economy.

Examples of the inorganic substrate used in the process for producing a semiconductor integrated circuit of the present invention include materials used for semiconductor circuits, such as silicon, polysilicon, silicon oxide films, aluminum, aluminum alloys, titanium, titanium-tungsten, titanium nitride, and tungsten; compound semiconductors, such as gallium-arsenic, gallium-phosphorus, and indium-phosphorus; and glass substrates of LCD.

The removing agent composition for a photoresist of the present invention is used for removing a photoresist layer applied onto an inorganic substrate, a photoresist layer which is left remaining after dry etching of an inorganic substrate masked with a photoresist layer, or residues of a photoresist which are left remaining after dry etching of an inorganic substrate masked with a photoresist layer and subsequent ashing of the photoresist layer. In the operation of removing the layer or the residues, heating or a treatment by ultrasonic wave may suitably be used in combination.

In general, the layer or the residues of the photoresist can sufficiently be removed at a room temperature. Heating or a treatment by ultrasonic wave may also be used in combination where necessary.

The method of immersion is generally conducted in the treatment using the removing agent composition of the present invention. However, other methods, such as the method of spraying, may also be used.

When the removing agent composition of the present invention is used, it is not necessary that the product obtained after the removal of the photoresist is rinsed with an organic solvent, such as an alcohol. The rinsing with water alone is sufficient.

To summarize the advantages of the present invention, by using the removing agent composition for a photoresist of the present invention, a layer of a photoresist applied onto an inorganic substrate, a layer of a photoresist remaining after dry etching of an inorganic substrate which is masked by the layer, or residues of a layer of a photoresist remaining after dry etching of an inorganic substrate which is masked by the layer and subsequent ashing of the layer can be removed easily at a low temperature in a short time. Ultra-fine working is enabled without causing corrosion of the wiring material of the circuit at all. The product obtained after the removal of the photoresist can be rinsed with water alone, and rinsing with an organic solvent, such as an alcohol, is not necessary. Integrated circuits can be produced with a high accuracy. Therefore, in accordance with the process for producing a semiconductor integrated circuit of the present invention, integrated circuits having a high accuracy can very advantageously be produced industrially.

The present invention is described in more detail with reference to examples in the following. However, the present invention is not limited by the examples.

FIG. 1 shows a sectional view of a semiconductor integrated circuit obtained by forming a circuit of aluminum 3 by dry etching using a layer of a resist 4 as the mask. In FIG. 1, the substrate 1 of the semiconductor integrated circuit is coated with a layer of an oxide 2, and has layers at the sides 5 to protect the sides during the etching.

Figure 2:
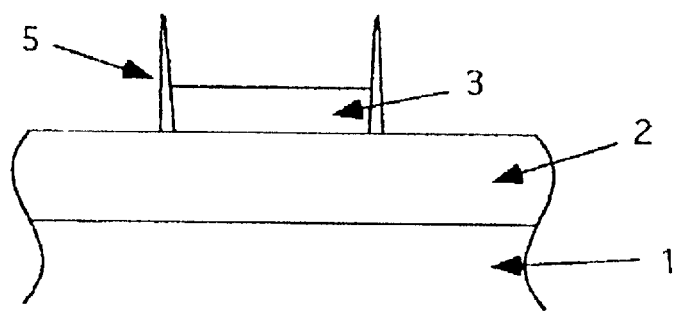
FIG. 2 shows a sectional view of a semiconductor integrated circuit obtained by ashing the layer of a resist 4 in the semiconductor integrated circuit shown in FIG. 1 with oxygen plasma to remove the layer of a resist 4.

FIG. 2 shows a sectional view of a semiconductor integrated circuit obtained by ashing the layer of a resist 4 in the semiconductor integrated circuit shown in FIG. 1 with oxygen plasma to remove the layer of a resist 4. In FIG. 2, the residues of the photoresist at the sides (the accumulated layers to protect the sides) 5 are left remaining without being removed by the oxygen plasma although the upper parts of the residues are deformed in such a manner that they are open with respect to the central line of the circuit of aluminum 3.

Examples 1 to 9 and Comparative Examples 1 to 4

The semiconductor integrated circuit shown in FIG. 1 was immersed into a removing agent composition having a composition shown in Table 1 for a specified time. After being immersed, the integrated circuit was dried and observed under an electron microscope (SEM). The property for removal of the layer of a photoresist 4 and the residues of the photoresist 5 and the corrosion of the circuit of aluminum (AL) 3 were evaluated by the observation, and the results are shown in Table 1. The results of the evaluation are shown in accordance with the following classification:

(the property for removal)

○: completely removed
Δ: partly remained
x: mostly remained (the corrosion)

○: no corrosion at all
Δ: partial corrosion
x: severe corrosion

TABLE 1-1

|  | quaternary ammonium hydroxide | | nucleophilic amine compound | | sugar alcohol | |
| --- | --- | --- | --- | --- | --- | --- |
|  | type | amount (% by wt.) | type | amount (% by wt.) | type | amount (% by wt.) |
| Example 1 | tetramethyl-ammonium hydroxide (TMAH) | 10 | hydrazine | 15 | sorbitol | 10 |
| Example 2 | trimethyl(2-hydroxyethyl) ammonium hydroxide (choline) | 10 | hydrazine | 15 | sorbitol | 10 |
| Example 3 | choline | 10 | methyl-hydrazine | 15 | sorbitol | 10 |
| Example 4 | TMAH | 10 | hydroxylamine | 15 | sorbitol | 10 |
| Example 5 | choline | 10 | hydroxylamine | 15 | sorbitol | 10 |
| Example 6 | TMAH | 10 | hydroxylamine | 15 | xylitol | 10 |
| Example 7 | TMAH | 15 | hydroxylamine | 10 | sorbitol | 15 |
| Example 8 | TMAH | 5 | hydroxylamine | 20 | sorbitol | 10 |
| Comparative Example 1 | TMAH | 10 | — | — | — | — |
| Comparative Example 2 | TMAH | 10 | hydroxylamine | 15 | — | — |
| Comparative Example 3 | — | — | hydroxylamine | 15 | sorbitol | 10 |
| Comparative Example 4 | — | — | — | — | sorbitol | 15 |

TABLE 1-2

| | water (% by wt.) | condition of treatment temperature (°C.) | time (min) | property for removal layer of photoresist | residues of photoresist | corrosion of circuit of AL 3 |
|---|---|---|---|---|---|---|
| Example 1 | 65 | 50 | 10 | ○ | ○ | ○ |
| Example 2 | 65 | 50 | 10 | ○ | ○ | ○ |
| Example 3 | 65 | 50 | 10 | ○ | ○ | ○ |
| Example 4 | 65 | 50 | 10 | ○ | ○ | ○ |
| Example 5 | 65 | 50 | 10 | ○ | ○ | ○ |
| Example 6 | 65 | 50 | 10 | ○ | ○ | ○ |
| Example 7 | 60 | 40 | 10 | ○ | ○ | ○ |
| Example 8 | 65 | 60 | 10 | ○ | ○ | ○ |
| Comparative Example 1 | 90 | 50 | 10 | ○ | △ | × |
| Comparative Example 2 | 75 | 50 | 10 | ○ | ○ | × |
| Comparative Example 3 | 75 | 50 | 10 | × | × | ○ |
| Comparative Example 4 | 85 | 50 | 10 | × | × | ○ |

Examples 9 to 16 and Comparative Examples 5 to 8

The semiconductor integrated circuit shown in FIG. 2 which had been treated by the ashing was immersed into a removing agent composition having a composition shown in Table 2 for a specified time. After being immersed, the integrated circuit was rinsed with ultra-pure water, dried, and observed under an electron microscope (SEM). The property for removal of the layer of a photoresist 4 and the residues of the photoresist 5 and the corrosion of the circuit of aluminum (AL) 3 were evaluated by the observation, and the results are shown in Table 2. The results of the evaluation are shown in accordance with the same classification as that used for the results shown in Table 1.

TABLE 2-1

| | quaternary ammonium hydroxide | | nucleophilic amine compound | | sugar alcohol | |
|---|---|---|---|---|---|---|
| | type | amount (% by wt.) | type | amount (% by wt.) | type | amount (% by wt.) |
| Example 9 | tetramethyl-ammonium hydroxide (TMAH) | 10 | hydrazine | 15 | sorbitol | 10 |
| Example 10 | trimethyl(2-hydroxyethyl)-ammonium hydroxide (choline) | 10 | hydrazine | 15 | sorbitol | 10 |
| Example 11 | choline | 10 | methyl-hydrazine | 15 | sorbitol | 10 |
| Example 12 | TMAH | 10 | hydroxylamine | 15 | sorbitol | 10 |
| Example 13 | choline | 10 | hydroxylamine | 15 | sorbitol | 10 |
| Example 14 | TMAH | 10 | hydroxylamine | 15 | xylitol | 10 |
| Example 15 | TMAH | 15 | hydroxylamine | 10 | sorbitol | 15 |
| Example 16 | TMAH | 5 | hydroxylamine | 20 | sorbitol | 10 |
| Comparative Example 5 | TMAH | 10 | — | — | — | — |
| Comparative Example 6 | TMAH | 10 | hydroxylamine | 15 | — | — |
| Comparative Example 7 | — | — | hydroxylamine | 15 | sorbitol | 10 |
| Comparative Example 8 | — | — | — | — | sorbitol | 15 |

TABLE 2-2

|  | condition of treatment | | | property for removal | corrosion |
|---|---|---|---|---|---|
|  | water (% by wt.) | temperature (°C.) | time (min) | residues of photoresist | of circuit of AL 3 |
| Example 9 | 65 | 50 | 10 | ◯ | ◯ |
| Example 10 | 65 | 50 | 10 | ◯ | ◯ |
| Example 11 | 65 | 50 | 10 | ◯ | ◯ |
| Example 12 | 65 | 50 | 10 | ◯ | ◯ |
| Example 13 | 65 | 50 | 10 | ◯ | ◯ |
| Example 14 | 65 | 50 | 10 | ◯ | ◯ |
| Example 15 | 60 | 40 | 10 | ◯ | ◯ |
| Example 16 | 65 | 60 | 10 | ◯ | ◯ |
| Comparative Example 5 | 90 | 50 | 10 | Δ | × |
| Comparative Example 6 | 75 | 50 | 10 | ◯ | × |
| Comparative Example 7 | 75 | 50 | 10 | × | ◯ |
| Comparative Example 8 | 85 | 50 | 10 | × | ◯ |

What is claimed is:

1. A removing agent composition for a photoresist comprising 0.01 to 20% by weight of a quaternary ammonium hydroxide represented by the formula $((R^1)_3N\text{---}R)^+ \cdot OH^-$, (wherein R represents an unsubstituted alkyl group having 1 to 4 carbon atoms or a hydroxy-substituted alkyl group having 1 to 4 carbon atoms, and $R^1$ represents an alkyl group having 1 to 3 carbon atoms, 1 to 80% by weight of a nucleophilic amine having an oxidation-reduction potential, 0.5 to 20% by weight of a sugar and/or a sugar alcohol, and water in the remaining amount.

2. In a process for producing a semiconductor integrated circuit including applying a photoresist onto an inorganic substrate, forming a pattern as a mask on the photoresist by exposure to light and development etching portions of the inorganic substrate which are not masked by the pattern to form a fine circuit and removing the photoresist from the inorganic substrate, or after forming the fine circuit, causing the photoresist to be ashed and removing remaining residues of the photoresist from the inorganic substrate, the improvement comprising removing the photoresist applied onto the inorganic substrate by contacting the photoresist on the inorganic substrate with the removing agent composition according to claim 1.

3. The process according to claim 2 wherein the portions of the inorganic substrate which are not masked are dry etched, and then the photoresist formed to the mask is removed.

4. The process according to claim 2 wherein the portions of the inorganic substrate which are not masked are dry etched, then the photoresist formed to the mask is ashed, and residues of the photoresist remaining after being ashed are removed.

5. The removing agent according to claim 1 wherein the quaternary ammonium hydroxide is selected from the group consisting of tetramethylammonium hydroxide, tetraethylammonium hydroxide, tetrapropylammonium hydroxide, tetrabutylammonium hydroxide, trimethylethylammonium hydroxide, dimethyldiethylammonium hydroxide, trimethyl(2-hydroxyethyl)ammonium hydroxide, triethyl(2-hydroxyethyl)ammonium hydroxide, tripropyl(2-hydroxyethyl)ammonium hydroxide, trimethyl(1-hydroxypropyl)ammonium hydroxide and tributyl(2-hydroxyethyl)ammonium hydroxide.

6. The removing agent according to claim 5 wherein the quaternary ammonium hydroxide is in an amount of 0.01 to 10% by weight.

7. The removing agent according to claim 1 wherein the quaternary ammonium hydroxide is selected from the group consisting of tetramethylammonium hydroxide and trimethyl(2-hydroxyethyl)ammonium hydroxide.

8. The removing agent according to claim 7 wherein the quaternary ammonium hydroxide is in an amount of 0.1 to 10% by weight.

9. The removing agent according to claim 8 wherein the nucleophilic amine having an oxidation-reduction potential is in an amount of 3 to 40% by weight and is selected from the group consisting of hydrazine, methylhydrazine, 1,1-dimethylhydrazine, hydrazinoethanol, hydroxylamine, N-methylhydroxylamine, N,N-dimethylhydroxylamine and N,N-diethylhydroxylamine.

10. The removing agent according to claim 1 wherein the nucleophilic amine having an oxidation-reduction potential is a hydrazine of the formula $R^1R^2N\text{---}NR^3R^4$, wherein $R^1$, $R^2$, $R^3$ and $R^4$ are each a hydrogen atom, an alkyl group, a cycloalkyl group, an alkenyl group, a substituted carboxyl group, an alkylamino group, or a hydroxy-substituted alkyl group.

11. The removing agent according to claim 10 wherein the nucleophilic amine having an oxidation-reduction potential is selected from the group consisting of hydrazine, methylhydrazine, 1,1-dimethylhydrazine, hydrazinoethanol, hydroxylamine, N-methylhydroxylamine, N,N-dimethylhydroxylamine and N,N-diethylhydroxylamine.

12. The removing agent according to claim 11 wherein the nucleophilic amine having an oxidation-reduction potential is in an amount of 3 to 40% by weight.

13. The removing agent according to claim 1 wherein the nucleophilic amine having an oxidation-reduction potential is a hydroxylamine of the formula $R^1R^2M\text{---}O\text{---}R^3$, wherein $R^1$, $R^2$ and $R^3$ are each a hydrogen atom, an alkyl group, a cycloalkyl group, an alkenyl group, an alkynyl group, a substituted carboxyl group, an alkylamino group or a hydroxy-substituted alkyl group.

14. The removing agent according to claim 13 wherein the nucleophilic amine having an oxidation-reduction potential is selected from the group consisting of hydrazine, methylhydrazine, 1,1-dimethylhydrazine, hydrazinoethanol, hydroxylamine, N-methylhydroxylamine, N,N-dimethylhydroxylamine and N,N-diethylhydroxylamine.

15. The removing agent according to claim 14 wherein the nucleophilic amine having an oxidation-reduction potential is in an amount of 3 to 40% by weight.

16. The removing agent according to claim 1 which contains 1 to 15 weight % of the sugar, said sugar being selected from the group consisting of a glycerol aldehyde having 3 to 6 carbon atoms, threose, arabinose, xylose, ribose, ribulose, xylulose, glucose, mannose, galactose, tagatose, allose, altrose, gluose, idose, talose, sorbose, psicose and fruit sugar.

17. The removing agent according to claim 16 wherein said sugar is selected from the group consisting of glucose, mannose and galactose.

18. The removing agent according to claim 1 which contains 1 to 15 weight % of the sugar alcohol, said sugar alcohol being selected from the group consisting of threitol, erythritol, adonitol, arabitol, xylitol, talitol, sorbitol, mannitol, iditol and dulcitol.

19. The removing agent according to claim 18 wherein said sugar alcohol is selected from the group consisting of sorbitol, mannitol and xylitol.

* * * * *